(12) United States Patent
Tang

(10) Patent No.: US 9,978,299 B2
(45) Date of Patent: May 22, 2018

(54) TRANSPARENT DISPLAY

(71) Applicant: Wuhan China Star Optoelectronics Technology Co., Ltd., Wuhan, Hubei (CN)

(72) Inventor: Yuejun Tang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 25 days.

(21) Appl. No.: 15/055,583

(22) Filed: Feb. 27, 2016

(65) Prior Publication Data
US 2017/0132970 A1 May 11, 2017

(30) Foreign Application Priority Data

Nov. 11, 2015 (CN) .......................... 2015 1 0765344

(51) Int. Cl.
*G09G 3/20* (2006.01)
*G09G 3/3208* (2016.01)
(Continued)

(52) U.S. Cl.
CPC ................. *G09G 3/20* (2013.01); *G02B 6/00* (2013.01); *G02B 27/01* (2013.01); *G02B 27/22* (2013.01); *G09G 3/003* (2013.01); *G09G 3/3208* (2013.01); *G09G 3/3607* (2013.01); *H01L 25/048* (2013.01); *H04N 13/00* (2013.01); *G02F 1/1347* (2013.01); *G02F 1/133615* (2013.01);
(Continued)

(58) Field of Classification Search
CPC ............ G09G 2300/023; G09G 3/003; G02B 27/22–27/2292; G02B 27/24; G02B 27/26; H04N 13/04–13/0497
See application file for complete search history.

(56) References Cited

U.S. PATENT DOCUMENTS 4,371,345 A * 2/1983 Palmer ............... G02B 27/2278
428/13
6,246,451 B1 * 6/2001 Matsumura ........ G02B 27/2214
348/59
(Continued)

FOREIGN PATENT DOCUMENTS

CN 103018941 A 4/2013
CN 103440822 A 12/2013
(Continued)

*Primary Examiner* — Gene W Lee
(74) *Attorney, Agent, or Firm* — Andrew C. Cheng

(57) ABSTRACT

The present invention discloses a transparent display, comprising a first display, comprising a plurality of first display regions and a plurality of transparent regions alternately arranged along a first direction; a second display, comprising a plurality of second display regions and a plurality of second transparent regions which are alternately located along the first direction, and the second display is laminated with the first display and located at one side of the first display in an image display direction, and the vertical projections of the second display regions on the first display completely coincide with the first transparent regions, and the vertical projections of the second transparent regions on the first display completely coincide with the first transparent regions; a camera shooting module; a signal process module.

10 Claims, 6 Drawing Sheets

(51) Int. Cl.
*G09G 3/36* (2006.01)
*G09G 3/00* (2006.01)
*H01L 25/04* (2014.01)
*G02B 6/00* (2006.01)
*G02B 27/01* (2006.01)
*G02B 27/22* (2018.01)
*H04N 13/00* (2018.01)
*H01L 27/32* (2006.01)
*G02F 1/1335* (2006.01)
*G02F 1/1347* (2006.01)
*G09G 3/34* (2006.01)

(52) U.S. Cl.
CPC ....... *G02F 2203/01* (2013.01); *G09G 3/3406* (2013.01); *G09G 2300/023* (2013.01); *G09G 2300/0452* (2013.01); *H01L 27/3211* (2013.01)

(56) References Cited

U.S. PATENT DOCUMENTS

| | | | | |
|---|---|---|---|---|
| 6,417,969 | B1* | 7/2002 | DeLuca | G02B 27/2235 345/8 |
| 6,559,813 | B1* | 5/2003 | DeLuca | G02B 27/22 345/629 |
| 8,944,609 | B2* | 2/2015 | Fox | G09G 5/14 353/121 |
| 9,170,643 | B2* | 10/2015 | Dominici | G02B 27/01 |
| 9,437,131 | B2* | 9/2016 | Nagara | G09G 3/32 |
| 9,536,499 | B2* | 1/2017 | Fox | G09G 5/14 |
| 9,706,193 | B2* | 7/2017 | Shinohara | H04N 13/0452 |
| 2013/0271445 | A1* | 10/2013 | Park | G09G 5/003 345/212 |
| 2013/0328930 | A1* | 12/2013 | Lee | G06T 19/006 345/633 |
| 2013/0335348 | A1* | 12/2013 | Nam | G09G 3/3208 345/173 |
| 2014/0035942 | A1* | 2/2014 | Yun | G09G 5/006 345/592 |
| 2014/0139458 | A1 | 5/2014 | Premutico et al. | |
| 2014/0184669 | A1* | 7/2014 | Oh | G09G 3/3208 345/694 |
| 2014/0292825 | A1* | 10/2014 | Kim | G09G 3/003 345/690 |
| 2014/0307430 | A1* | 10/2014 | Lo | G09F 13/00 362/231 |
| 2015/0022564 | A1* | 1/2015 | Zhang | G02F 1/1347 345/690 |
| 2015/0179139 | A1* | 6/2015 | Watanabe | G09F 9/33 345/592 |
| 2015/0220299 | A1* | 8/2015 | Kim | G06F 3/0488 345/1.3 |
| 2015/0228217 | A1* | 8/2015 | Perdices-Gonzalez | G09G 3/348 345/5 |
| 2015/0228229 | A1* | 8/2015 | Priede | G09G 3/003 345/213 |
| 2016/0071448 | A1* | 3/2016 | Schwarz | G09G 3/20 349/83 |
| 2016/0231974 | A1* | 8/2016 | Lee | G06F 3/1431 |
| 2016/0306097 | A1* | 10/2016 | Fujita | G09G 3/003 |

FOREIGN PATENT DOCUMENTS

| | | |
|---|---|---|
| CN | 103870232 A | 6/2014 |
| CN | 103903521 A | 7/2014 |
| CN | 104246688 A | 12/2014 |
| CN | 104281429 A | 1/2015 |

* cited by examiner

TRANSPARENT DISPLAY

FIELD OF THE INVENTION

The present invention relates to a transparent display technology field, and more particularly to a transparent display.

BACKGROUND OF THE INVENTION

The transparent display means that the display itself has the light transmission ability of certain level. The user can clearly watch the background behind the display as seeing the display image of the display. Therefore, the transparent display is applied for building widows, car windows or shop windows.

However, for watching some specific environment (such as some specific outdoor scene) the transparent display according to prior art must have one surface facing the aforesaid specific environment. Nevertheless, not every specific environment has suitable position for placing the transparent display. As it were, not every position of placing the transparent display can be used for directly watching the some specific environment. The position of replacing the transparent display and the environment for directly watching are restricted by the limitation of the space. For instance, the enclosed room, the outdoor scene for watching is not the direction which is the back of the display. Therefore, the application of the transparent display is limited.

SUMMARY OF THE INVENTION

An objective of the present invention is to provide a transparent display which can watch the outdoor environment image in an enclosed environment.

For realizing the aforesaid objective, the technical solution utilized by the embodiments of the present invention is:

Provided is a transparent display, comprising:

a first display, and the first display comprises a plurality of first display regions and a plurality of transparent regions alternately arranged along a first direction;

a second display, the second display is laminated with the first display and located at one side of the first display in an image display direction, and the second display comprises a plurality of second display regions and a plurality of second transparent regions which are alternately located along the first direction, and the second transparent regions are employed to transmit the light emitted by the first display to human eyes;

vertical projections of the first display regions on the second display completely coincide with the second transparent regions, and vertical projections of the first transparent regions on the second display completely coincide with the first transparent regions;

a camera shooting module, and the camera shooting module is employed to shoot an environment image to form an environment image signal;

a signal process module, and the signal process module receives the environment image signal and converts the same into a first display image signal, and the first display receives the first display image signal and shows the same in the first display regions; the signal process module further receives a picture image signal and converts the same into a second display image signal, and the second display receives the second display image signal and shows the same in the second display regions.

Preferably, the first transparent regions are not coated with color resist, or coated with white transparent color resist, or coated with a black matrix, and the second transparent regions are not coated with color resist or coated with white transparent color resist.

Preferably, as the first transparent regions are not coated with color resist, or coated with white transparent color resist, the second display is a liquid crystal display, and light revealed from the first transparent regions is employed to provide a backlight for the second display regions.

Preferably, the first display is a light emitting diode display.

Preferably, the first display is a liquid crystal display, and the transparent display further comprises a first backlight module, and the first backlight module is located at one side of the first display away from the second display.

Preferably, as the first transparent regions are coated with a black matrix, the second display is a liquid crystal display, and the second display further comprises a transparent second backlight module, and the second backlight module is located between the first display and the second display.

Preferably, as the first transparent regions are coated with a black matrix, the second display is a light emitting diode display.

Preferably, the first display comprises a plurality of first sub pixels, a plurality of second sub pixels and a plurality of third sub pixels, and the plurality of first sub pixels generate a first primary color light, and the plurality of second sub pixels generate a second primary color light and the plurality of third sub pixels generate a third primary color light, and the plurality of first sub pixels, the plurality of second sub pixels and the plurality of third sub pixels are alternately located in the plurality of first display regions in the first direction, and the second display comprises a plurality of first sub-pixels, a plurality of second sub-pixels and a plurality of third sub-pixels, and the plurality of first sub-pixels generate the first primary color light, and the plurality of second sub-pixels generate the second primary color light and the plurality of third sub-pixels generate the third primary color light, and the plurality of first sub-pixels, the plurality of second sub-pixels and the plurality of third sub-pixels are alternately located in the plurality of second display regions in the first direction.

Preferably, the first display comprises a plurality of first sub pixels, a plurality of second sub pixels and a plurality of third sub pixels, and the plurality of first sub pixels generate a first primary color light, and the plurality of second sub pixels generate a second primary color light and the plurality of third sub pixels generate a third primary color light, and the plurality of first sub pixels, the plurality of second sub pixels and the plurality of third sub pixels constitute sub pixel combinations, and each of the first display regions comprises at least one sub pixel combination, and the second display comprises a plurality of first sub-pixels, a plurality of second sub-pixels and a plurality of third sub-pixels, and the plurality of first sub-pixels generate the first primary color light, and the plurality of second sub-pixels generate the second primary color light and the plurality of third sub-pixels generate the third primary color light, and the plurality of first sub-pixels, the plurality of second sub-pixels and the plurality of third sub-pixels constitute sub-pixel combinations, and each of the second display regions comprises at least one sub-pixel combination.

Preferably, the plurality of first display regions and the plurality of first transparent regions of the first display commonly construct a first display area, and the plurality of second display regions and the plurality of second transparent regions of the second display commonly construct a second display area, and the first display area is larger than the second display area.

Compared with prior art, the present invention possesses benefits below:

The transparent display of the present invention shoots an environment image to form an environment image signal with the camera shooting module, and then, the signal process module converts the received environment image signal into the first display image signal and transmits the same to the first display for display. Thus, the transparent display in the enclosed environment can used for watching the outdoor environment image, which is beneficial for expanding the application field of the transparent display. It is understood that the shoot object of the camera shooting module according to the present invention will not be restricted by the placing position of the transparent display. Namely, the angle, the distance of the environment image watched on the transparent display are no longer limited by the space. Therefore, the transparent display has more flexible and more variable applications.

Furthermore, the signal process module further receives a picture image signal and converts the same into a second display image signal, and the second display receives the second display image signal and shows the same in the second display regions, and the vertical projections of the second display regions on the first display coincide with the first transparent regions, and the vertical projections of the second transparent regions on the first display coincide with the first display regions. Accordingly, the user can watch the picture image and the environment image on the transparent display of the present invention at the same time. Moreover, with the individual layer display of the first display and the second display, the issue that the picture image and the environment image shown in the transparent display is blur and chaos can be solved. The individual layer display also makes the image of the transparent display be more layered and stereoscopic. The user's experience is better.

BRIEF DESCRIPTION OF THE DRAWINGS

In order to more clearly illustrate the embodiments of the present invention, the following figures will be described in the embodiments are briefly introduced. It is obvious that the drawings are only some embodiments of the present invention, those of ordinary skill in this field can obtain other figures according to these figures without paying the premise.

DETAILED DESCRIPTION OF PREFERRED EMBODIMENTS

For better explaining the technical solution and the effect of the present invention, the present invention will be further described in detail with the accompanying drawings in the specific embodiments.

Figure 1:
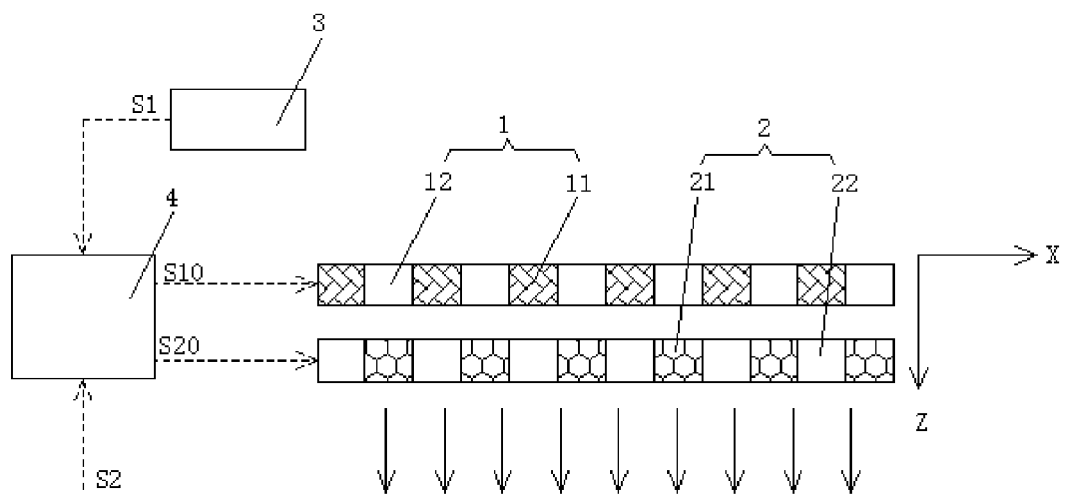
FIG. 1 is a top view structure diagram of a transparent display provided by the embodiment of the present invention.

Please refer to FIG. 1. FIG. 1 is a top view structure diagram of a transparent display provided by the embodiment of the present invention. The transparent display according to the embodiment of the present invention comprises a first display 1, a second display 2, a camera shooting module 3 and a signal process module 4. In this embodiment, the Z direction shown in FIG. 1 is an image display direction Z of the first display. The direction which the full line arrow set shown in FIG. 1 points to is the display direction of the transparent display of this embodiment. It is understood that because the first display 1 and the second display 2 are laminated in parallel. The display direction of the transparent display and the image display direction Z of the first display are parallel. As shown in FIG. 1, the second display 2 is laminated and located at one side of the first display 1 in the image display direction Z of the first display.

The first display 1 comprises a plurality of first display regions 11 (a plurality of shadow parts in the first display 1 in FIG. 1) and a plurality of transparent regions 12 (a plurality of blank parts in the first display 1 in FIG. 1) alternately arranged along a first direction X (the X direction shown in FIG. 1).

The second display 2 comprises a plurality of second display regions 21 (a plurality of shadow parts in the second display 2 in FIG. 1) and a plurality of second transparent regions 22 (a plurality of blank parts in the second display 2 in FIG. 1) which are alternately located along the first direction X, and the second transparent regions 22 are employed to transmit the light emitted by the first display 1 to human eyes.

Vertical projections of the first display regions 11 on the second display 2 completely coincide with the second transparent regions 22, and vertical projections of the first transparent regions 12 on the second display 2 completely coincide with the first transparent regions 12. Because the second transparent regions 22 can transmit the light emitted by the first display 1 to human eyes, i.e. can transmit the light emitted by the first display regions 11 to human eyes. Therefore, the human eyes can see the image shown in the display regions 11 and the image in the second display regions 21 on the transparent display at the same time.

It is understood that for achieving the better display result for the transparent display, the second transparent regions 22 is not provided with a color resist layer or provided with a white transparent resist layer to promote the light transmission of the first display regions 11.

The camera shooting module 3 is employed to shoot an environment image to form an environment image signal S1. As shown in FIG. 1, the dot line arrow represents the signal transmission relationship in the transparent display of this embodiment. The signal process module 4 receives the environment image signal S1 and converts the same into a first display image signal S10, and the first display 1 receives the first display image signal S10 and shows the same in the first display regions 11. The signal process module 4 further receives a picture image signal S2 and converts the same into a second display image signal S20, and the second display 2 receives the second display image signal S20 and shows the same in the second display regions 21.

In this embodiment, the transparent display shoots an environment image to form an environment image signal S1 with the camera shooting module 3, and then, the signal process module 4 converts the received environment image signal S1 into the first display image signal S10 and transmits the same to the first display 1 for display. Thus, the transparent display in the enclosed environment can used for watching the outdoor environment image, which is beneficial for expanding the application field of the transparent display. It is understood that the shoot object of the camera shooting module in this embodiment will not be restricted by the placing position of the transparent display. Namely, the angle, the distance of the environment image watched on the transparent display in this embodiment are no longer limited by the space. Therefore, the transparent display has more flexible and more variable applications.

Furthermore, because the signal process module 4 further receives a picture image signal S2 and converts the same into a second display image signal S20, and the second display 2 receives the second display image signal S20 and shows the same in the second display regions 21, and the vertical projections of the second display regions 21 on the first display 1 coincide with the first transparent regions 12, and the vertical projections of the second transparent regions 22 on the first display 1 coincide with the first display regions 11. Accordingly, the user can watch the picture image and the environment image on the transparent display of this embodiment at the same time. Moreover, with the individual layer display of the first display 1 and the second display 2, the issue that the picture image and the environment image shown in the transparent display is blur and chaos can be solved. The individual layer display also makes the image of the transparent display be more layered and stereoscopic. The user's experience is better.

It is understood that the picture image signal S2 in this embodiment can be any picture image signal externally received with the transparent display of this embodiment. The movie, the news, the animation can be illustrated. The picture image signal S2 according to the present invention is not restricted to the types in the aforesaid embodiments. Without departing from the spirit or essential characteristics of the present invention, the solutions of the present invention achieved in other specific or similar forms should be within the protected scope of the present invention.

Certainly, the transparent display of this embodiment can have other display modes.

As an illustration, as the user only needs to watch the picture image, the camera shooting module 3 and the first display 1 can be shut down. The signal process module 4 receives a picture image signal S2 and converts the same into a second display image signal S20, and the second display 2 receives the second display image signal S20 and shows the same in the second display regions 21. The transparent display can achieve the function of only watching the picture image. Furthermore, the transmittance of the second transparent regions 22 can be adjusted. For example, the transmittance can be lowered to make the display quality of the second display 2 better so that the transparent display can have better display result.

Alternatively, as the user only needs to watch the environment image, the camera shooting module 3 shoots the environment image and forms an environment image signal S1. The signal process module 4 only receives the environment image signal S1 and converts the same into a first display image signal S10, and the first display 1 receives the first display image signal S10 and shows the same in the first display regions 11, and the second display 2 are blank for work. The transparent display achieves the function of only watching the environment image.

Furthermore, the signal process module 4 also can convert the received environment image signal S1 into the second display image signal S20. Then, the first display 1 does not work. In such mode, the transparent display cannot only achieve the function of only watching the environment image but also makes the first display 1 not work and the energy consumption is decreased.

Furthermore, the camera shooting module can form two or more environment images at the same time, and shows the same on the first display 1 at the same time, or shows the same on the second display 2 at the same time, or shows the same on the first display 1 and the second display 2 at the same time. As an illustration, the environment image signal S1 is processed to be the first display image signal S10 and the second display image signal S20 in the signal process module 4 for being respectively shown on the first display 1 and the second display 2. Therefore, the user can watch many environment images on the transparent display of this embodiment at the same time, which are clear and more layered and stereoscopic. The user's experience is better.

Figure 2:
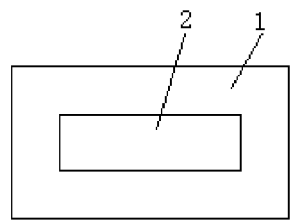
FIG. 2 is a top view structure diagram of another transparent display provided by the embodiment of the present invention.

As being a preferred embodiment of the present invention, the plurality of first display regions 11 and the plurality of first transparent regions 12 of the first display 1 commonly construct a first display area, and the plurality of second display regions 21 and the plurality of second transparent regions 22 of the second display 2 commonly construct a second display area, and the first display area is larger than the second display area. As an illustration, as shown in FIG. 2, the rectangular area pointed by 1 represents the first display area, and the rectangular area pointed by 2 represents the second display area, and the first display area is larger than the second display area. In this embodiment, the second display can be control to show the picture image. In the image display direction Z of the first display, the portion of the first display area which is not overlapped with the second display area shows the environment image. The transparent display in this working mode can allow watching the picture image and the environment image at the same time, which is clear and more layered and stereoscopic. The user's experience is better.

It should be understood that in this embodiment, the first display 1 or/and the second display 2 can be a light emitting diode display (including the inorganic light emitting diode display (LED) or the organic light emitting diode display (OLED)), a liquid crystal display or other displays which is suitable for forming images.

As being a preferred embodiment of the present invention, as shown in FIG. 1, the first display 1 is a light emitting diode display, and the second display 2 can be a light emitting diode display or a liquid crystal display. As the second display 2 is the liquid crystal display, and preferably, the second display 2 is the organic light emitting diode display. Because the second display 2 is a self light emitting structure, the first transparent regions 12 are set to be opaque non-display regions. For example, a black matrix can be arranged on the first transparent regions 12, and some wiring structures of the first display regions 11 are located under the black matrix for optimizing the wiring layout to reduce the volume of the first display 1. As the second display 2 is the liquid crystal display, the first transparent regions 12 are not coated with color resist, or coated with white transparent color resist, and light revealed from the first transparent regions 12 is employed to provide a backlight for the second display regions 21 of the second display 2. The second display 2 no longer requires the backlight module for a special purpose, and the energy consumption of the transparent display is reduced.

Figure 3:
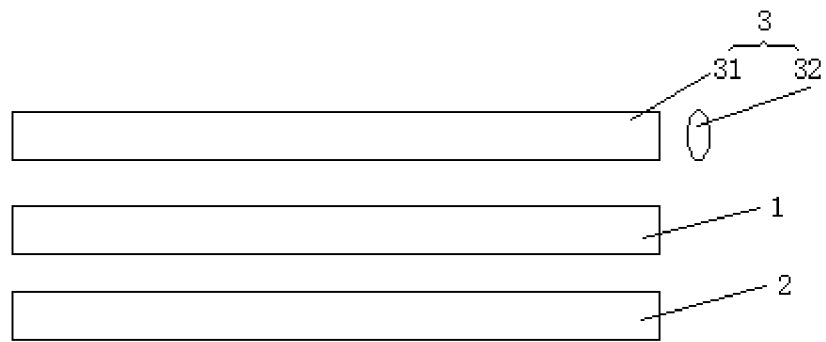
FIG. 3 is a top view structure diagram of one another transparent display provided by the embodiment of the present invention.

Please refer to FIG. 3. As being another preferred embodiment of the present invention, the first display 1 is a liquid crystal display, and the second display 2 is a light emitting diode display or a liquid crystal display. The transparent display further comprises a first backlight module 3, and the first backlight module 3 is located at one side of the first display 1 away from the second display 2. Furthermore, the first backlight module 3 comprises a first light guide plate 31 and a first light source 32. The first light guide plate 31 comprises a first reflective surface and a first illuminating surface which are oppositely located, and a first lateral incident surface connected between a first incident surface and the first illuminating surface, and a total reflection reflective layer is located on the first reflective surface. The first illuminating surface is located close to the first display 1, and the first light source 32 is located close to the first lateral incident surface. It is understood that the backlight module 3 employed in this embodiment is the light source side light type. The light emitting arrangement of the light source of the backlight module 3 is not restricted thereto, and can be other implementations. The direct type backlight source can be illustrated.

Furthermore, as the second display 2 is the liquid crystal display, and preferably, the second display 2 is the organic light emitting diode display. Because the second display 2 is a self light emitting structure, the first transparent regions 12 are set to be opaque non-display regions. For example, a black matrix can be arranged on the first transparent regions 12, and some wiring structures of the first display regions 11 are located under the black matrix for optimizing the wiring layout to reduce the volume of the first display 1. As the second display 2 is the liquid crystal display, the first transparent regions 12 are not coated with color resist, or coated with white transparent color resist, and light revealed from the first transparent regions 12 is employed to provide a backlight for the second display regions 21 of the second display 2. The second display 2 no longer requires the backlight module for a special purpose, and the energy consumption of the transparent display is reduced.

Figure 4:
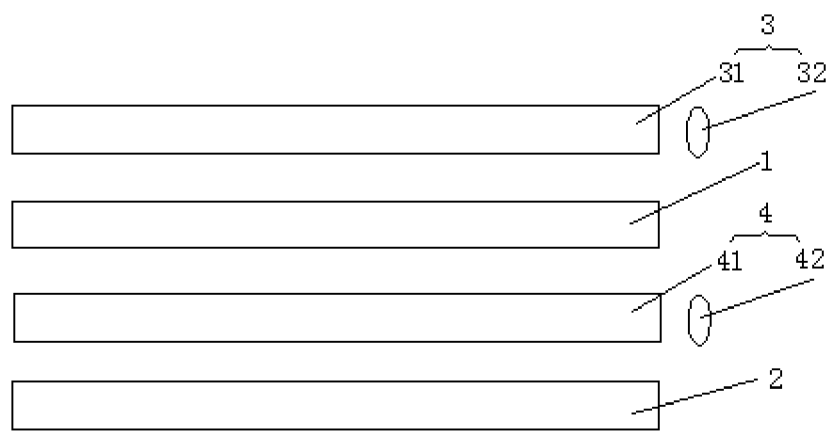
FIG. 4 is a top view structure diagram of one more another transparent display provided by the embodiment of the present invention.

Please refer to FIG. 4. As being one another preferred embodiment of the present invention, the first display 1 of the transparent display is a liquid crystal display, and the second display 2 also is a liquid crystal display. The transparent display further comprises a first backlight module 3 and a transparent second backlight module 4, and the first backlight module 3 is located at one side of the first display 1 away from the second display 2, and the second backlight module 4 is located between the first display 1 and the second display 2. Furthermore, the first backlight module 3 comprises a first light guide plate 31 and a first light source 32. The first light guide plate 31 comprises a first reflective surface and a first illuminating surface which are oppositely located, and a first lateral incident surface connected between a first incident surface and the first illuminating surface, and a total reflection reflective layer is located on the first reflective surface. The first illuminating surface is located close to the first display 1, and the first light source 32 is located close to the first lateral incident surface. The second backlight module 4 comprises a second light guide plate 41 and a second light source 42. The second light guide plate 41 is a transparent light guide plate, and the second light guide plate 41 comprises a second incident surface and a second illuminating surface which are oppositely located, and a second lateral incident surface connected between the second incident surface and the second illuminating surface. The second incident surface is located close to the first display 1, and the second illuminating surface is located close to the second display 2, and the second light source 42 is located close to the second lateral incident surface. It is understood that the backlight module 3 employed in this embodiment is the light source side light type. The light emitting arrangement of the light source of the backlight module 3 is not restricted thereto, and can be other implementations. The direct type backlight source can be illustrated.

In this embodiment, because the second display 2 comprises the backlight module, and thus the first transparent regions 12 are set to be opaque non-display regions. For example, a black matrix can be arranged on the first transparent regions 12, and some wiring structures of the first display regions 11 are located under the black matrix for optimizing the wiring layout to reduce the volume of the first display 1.

Figure 5:
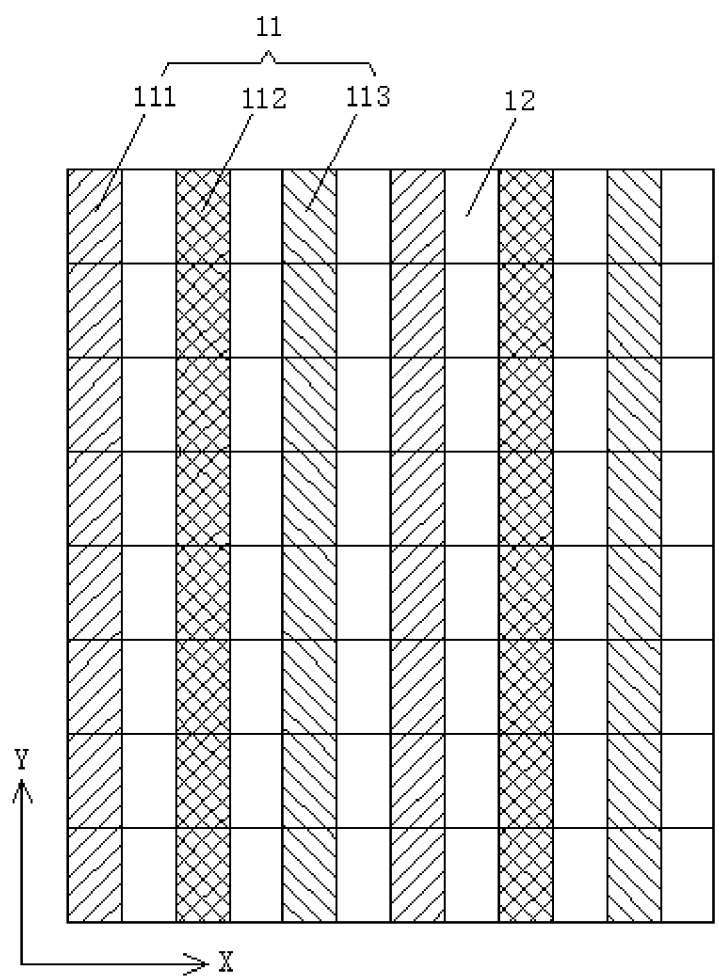
FIG. 5 is a front view structure diagram of a first display of a transparent display provided by the embodiment of the present invention.
Figure 6:
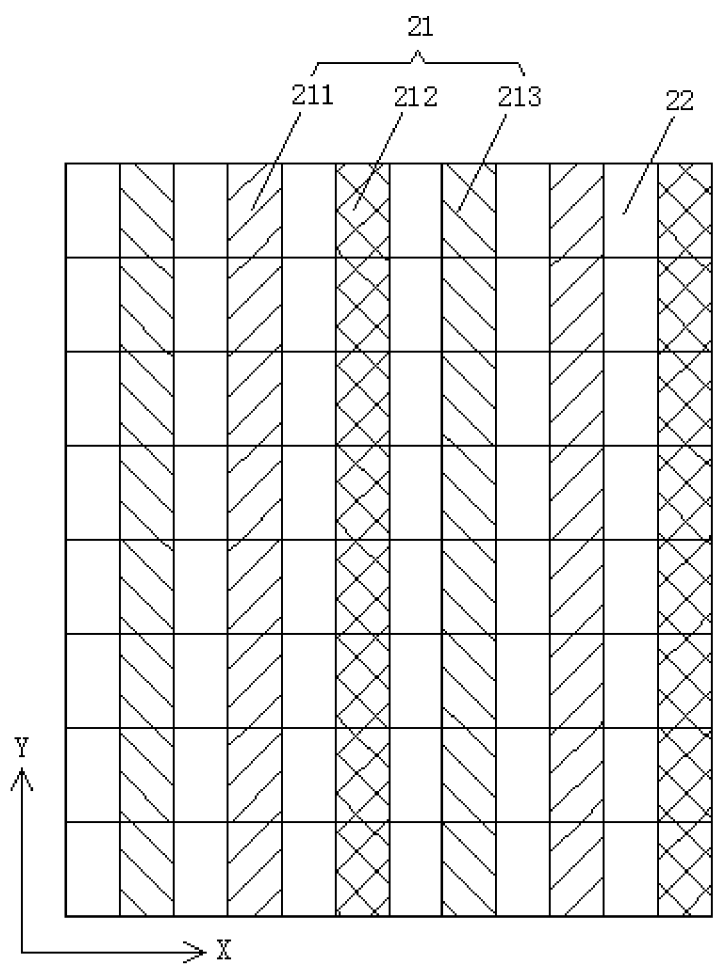
FIG. 6 is a front view structure diagram of a second display of a transparent display provided by the embodiment of the present invention.
Figure 7:
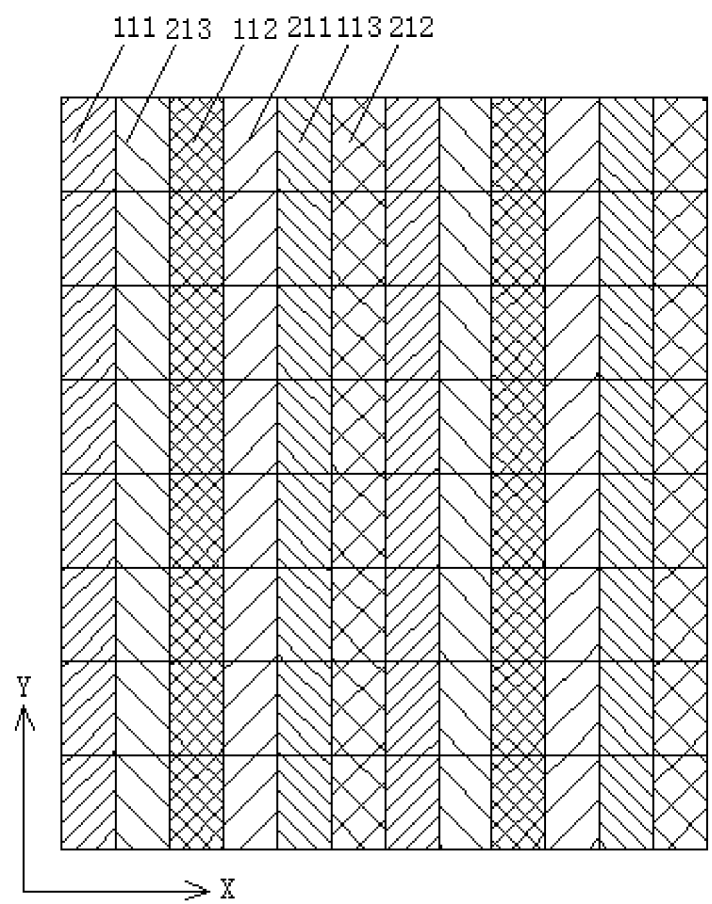
FIG. 7 is a front view structure diagram of a transparent display provided by the embodiment of the present invention.

Please refer from FIG. 5 to FIG. 7. The first display 1 of the transparent display according to the embodiment of the present invention comprises a plurality of first sub pixels 111, a plurality of second sub pixels 112 and a plurality of third sub pixels 113, and the plurality of first sub pixels 111 generate a first primary color light, and the plurality of second sub pixels 112 generate a second primary color light and the plurality of third sub pixels 113 generate a third primary color light, and the plurality of first sub pixels 111, the plurality of second sub pixels 112 and the plurality of third sub pixels 113 are alternately located in the plurality of first display regions 111 in the first direction X and extended along a second direction Y, and the second direction Y is perpendicular with the first direction and the image display direction of the first display.

The second display 2 comprises a plurality of first sub-pixels 211, a plurality of second sub-pixels 212 and a plurality of third sub-pixels 213, and the plurality of first sub-pixels 211 generate the first primary color light, and the plurality of second sub-pixels 212 generate the second primary color light and the plurality of third sub-pixels 213 generate the third primary color light, and the plurality of first sub-pixels 211, the plurality of second sub-pixels 212 and the plurality of third sub-pixels 213 are alternately located in the plurality of second display regions 21 in the first direction X and extended along the second direction Y.

As shown in FIG. 1, FIG. 2, FIG. 5 to FIG. 7, because the vertical projections of the second display regions 21 on the first display 1 coincide with the first transparent regions 12, and the vertical projections of the second transparent regions 22 on the first display 1 coincide with the first display regions 11. All the sub pixel units and the sub-pixel units of the first display regions 11 of the first display and the second display regions 21 of the second display can be shown on the transparent display. Accordingly, the first display image signal and the second display image signal can be watched at the same time.

It should be understood that in this embodiment, an adjacent region of the first display region 11 of the first display 1 shown in FIG. 5 comprises two first display regions 11 and two first transparent regions 12. An adjacent region of the second display region 21 of the second display 2 shown in FIG. 6 comprises two second display regions 21 and two second transparent regions 22. However, the arrangements of the first display regions 11 and the first transparent regions 12, and the second display regions 21 and the second transparent regions 22 comprises the aforesaid types in the aforesaid embodiment but not limited thereto. Without departing from the spirit or essential characteristics of the present invention, the solutions of the present invention achieved in other specific or similar forms should be within the protected scope of the present invention. As an illustration, the first transparent regions 21 can be arranged all around the first display region 11 of the first display 1, and the first display regions 11 can be arranged all around the first transparent region 21; then, the second transparent regions 22 can be arranged all around the second display region 21 of the second display 2, and the second display regions 21 can be arranged all around the second transparent region 22.

Figure 8:
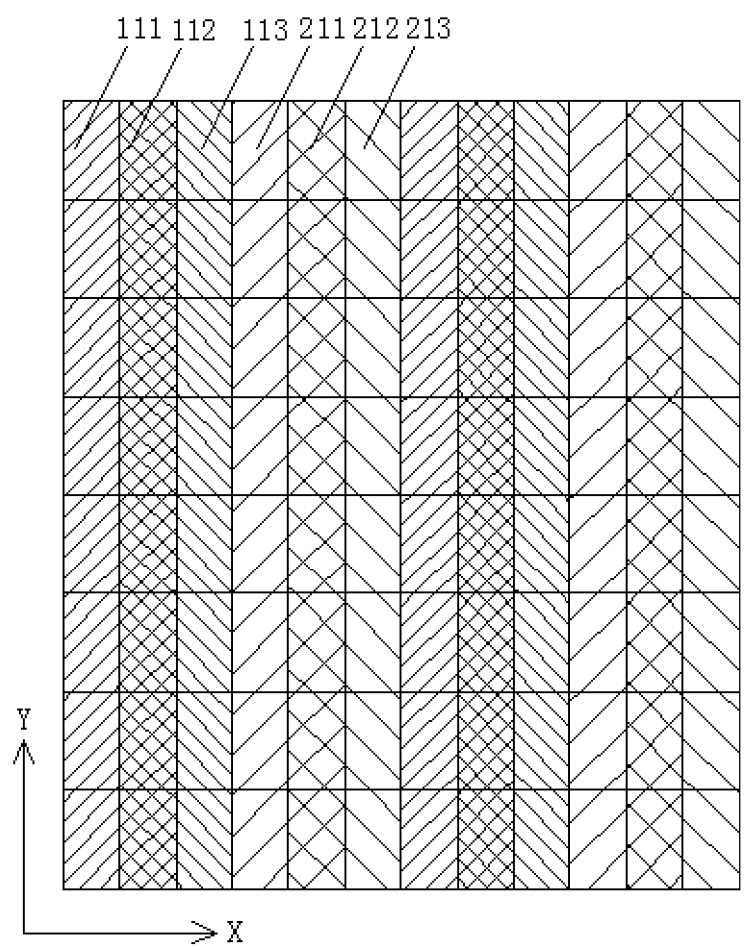
FIG. 8 is a front view structure diagram of another transparent display provided by the embodiment of the present invention.

It should be understood that in this embodiment, the sub pixel regions (111, 112 and 113) and the first transparent regions 12 of the first display 1 shown in FIG. 5 are alternately located. Namely, a single sub pixel region and the first transparent regions 12 are alternately located. The sub-pixel regions (211, 212 and 213) and the second transparent regions 22 of the second display 2 shown in FIG. 6 are alternately located. Namely, a single sub-pixel region and the second transparent regions 22 are alternately located. Therefore, as the transparent display performs display, as shown in FIG. 7, the single sub pixel region and the single sub-pixel region achieve the visualization respectively with the transparent regions intervally dislocated on the first display 1 and the second display 2. However, the arrangements of sub pixel regions with the first transparent regions 12 and the sub-pixels with the second transparent regions 22 according to the present invention are not restricted to the types in the aforesaid embodiments. Without departing from the spirit or essential characteristics of the present invention, the solutions of the present invention achieved in other specific or similar forms should be within the protected scope of the present invention. As an illustration, as shown in FIG. 8, the first display regions 11 can comprise at least one set of the first sub pixels 111, the second sub pixels 112 and the third sub pixels 113 at the same time. The second display regions 21 can comprise at least one set of the first sub-pixels 211, the second sub-pixels 212 and the third sub-pixels 213 at the same time. As the transparent display performs display, the set of sub pixel regions and the set of the sub-pixel regions achieve the visualization respectively with the transparent regions intervally dislocated on the first display 1 and the second display 2. Furthermore, the sizes of the sub pixel region and the sub-pixel region can be different. With the various arrangements of the sub pixel regions and the sub-pixel regions, the sizes and the reversing relationships of the first display regions 11 and the second display regions 12 can be changed to make the display more diversified and the application can be more flexible.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A transparent display in an enclosed environment, where a user of the transparent display is, comprising:
  a first display, and the first display comprises a plurality of first display regions and a plurality of transparent regions alternately arranged along a first direction;
  a second display, the second display is laminated with the first display and located at one side of the first display in an image display direction, and the second display comprises a plurality of second display regions and a plurality of second transparent regions which are alternately located along the first direction, and the second transparent regions are employed to transmit the light emitted by the first display to human eyes of the user;
  vertical projections of the first display regions on the second display completely coincide with the second transparent regions, and vertical projections of the first transparent regions on the second display completely coincide with the first transparent regions;
  a camera shooting module, and the camera shooting module is employed to shoot an environment image to form an environment image signal of an outdoor environment, which is not the enclosed environment where the user of the transparent display is;
  a signal process module, and the signal process module receives the environment image signal and converts the same into a first display image signal, and the first display receives the first display image signal and shows the same in the first display regions; the signal process module further receives a picture image signal and converts the same into a second display image signal, and the second display receives the second display image signal and shows the same in the second display regions to respectively show the environment image of the outdoor environment, which is not the enclosed environment and the picture image of the transparent display in the enclosed environment in a form of an individual layer display with the first display and the second display laminated with the first display, wherein the user watches the environment image signal of the outdoor environment shown by the first display and the picture image signal shown by the second display at the same time.

2. The transparent display according to claim 1, wherein the first transparent regions are not coated with color resist, or coated with white transparent color resist, or coated with a black matrix, and the second transparent regions are not coated with color resist or coated with white transparent color resist.

3. The transparent display according to claim 2, wherein as the first transparent regions are not coated with color resist, or coated with white transparent color resist, the second display is a liquid crystal display, and light revealed from the first transparent regions is employed to provide a backlight for the second display regions.

4. The transparent display according to claim 3, wherein the first display is a light emitting diode display.

5. The transparent display according to claim 3, wherein the first display is a liquid crystal display, and the transparent display further comprises a first backlight module, and the first backlight module is located at one side of the first display away from the second display.

6. The transparent display according to claim 2, wherein as the first transparent regions are coated with a black matrix, the second display is a liquid crystal display, and the second display further comprises a transparent second backlight module, and the second backlight module is located between the first display and the second display.

7. The transparent display according to claim 2, wherein as the first transparent regions are coated with a black matrix, the second display is a light emitting diode display.

8. The transparent display according to claim 2, wherein the first display comprises a plurality of first sub pixels, a plurality of second sub pixels and a plurality of third sub pixels, and the plurality of first sub pixels generate a first primary color light, and the plurality of second sub pixels generate a second primary color light and the plurality of third sub pixels generate a third primary color light, and the plurality of first sub pixels, the plurality of second sub pixels and the plurality of third sub pixels are alternately located in the plurality of first display regions in the first direction, and the second display comprises a plurality of first sub-pixels, a plurality of second sub-pixels and a plurality of third sub-pixels, and the plurality of first sub-pixels generate the first primary color light, and the plurality of second sub-pixels generate the second primary color light and the plurality of third sub-pixels generate the third primary color light, and the plurality of first sub-pixels, the plurality of second sub-pixels and the plurality of third sub-pixels are alternately located in the plurality of second display regions in the first direction.

9. The transparent display according to claim 2, wherein the first display comprises a plurality of first sub pixels, a plurality of second sub pixels and a plurality of third sub pixels, and the plurality of first sub pixels generate a first primary color light, and the plurality of second sub pixels generate a second primary color light and the plurality of third sub pixels generate a third primary color light, and the plurality of first sub pixels, the plurality of second sub pixels and the plurality of third sub pixels constitute sub pixel combinations, and each of the first display regions comprises at least one sub pixel combination, and the second display comprises a plurality of first sub-pixels, a plurality of second sub-pixels and a plurality of third sub-pixels, and the plurality of first sub-pixels generate the first primary color light, and the plurality of second sub-pixels generate the second primary color light and the plurality of third sub-pixels generate the third primary color light, and the plurality of first sub-pixels, the plurality of second sub-pixels and the plurality of third sub-pixels constitute sub-pixel combinations, and each of the second display regions comprises at least one sub-pixel combination.

10. The transparent display according to claim 1, wherein the plurality of first display regions and the plurality of first transparent regions of the first display commonly construct a first display area, and the plurality of second display regions and the plurality of second transparent regions of the second display commonly construct a second display area, and the first display area is larger than the second display area.

* * * * *